United States Patent [19]
Scholz

[11] Patent Number: 5,410,557
[45] Date of Patent: Apr. 25, 1995

[54] METHOD AND APPARATUS FOR RECOGNIZING VALID COMPONENTS IN A DIGITAL SIGNAL

[75] Inventor: Werner Scholz, Gehrden, Germany

[73] Assignee: Deutsche Thomson-Brandt GmbH, Villengen-Schwenningen

[21] Appl. No.: 124,357

[22] Filed: Sep. 20, 1993

Related U.S. Application Data

[63] Continuation of Ser. No. 863,979, Apr. 6, 1992.

[30] Foreign Application Priority Data

Aug. 30, 1989 [DE] Germany .................. 39 28 676.2

[51] Int. Cl.⁶ .................. H03M 13/00; G06F 11/00
[52] U.S. Cl. .................. 371/57.2; 371/37.1; 371/6
[58] Field of Search .......... 371/57.2, 57.1, 6, 5.1, 371/5.3, 60; 360/70, 71, 77.04, 51

[56] References Cited

U.S. PATENT DOCUMENTS

| | | | |
|---|---|---|---|
| 3,909,724 | 9/1975 | Spoth et al. | 371/6 |
| 4,080,589 | 3/1978 | Kline | 371/5.1 |
| 4,161,719 | 7/1979 | Parikh et al. | 371/57.2 |
| 4,184,181 | 1/1980 | Mijatovic | 360/77 |
| 4,328,583 | 5/1982 | Stodala | 371/57.2 |
| 4,594,616 | 6/1986 | Dischert | 360/36.1 |
| 4,800,562 | 1/1989 | Hicks | 371/5.1 |
| 4,860,324 | 8/1989 | Satomura | 371/57.2 |
| 4,876,614 | 10/1989 | Kaaden et al. | 360/10.2 |

FOREIGN PATENT DOCUMENTS

| | | | |
|---|---|---|---|
| 0096106 | 12/1983 | European Pat. Off. | G11B 5/09 |
| 0264035 | 4/1988 | European Pat. Off. | H03L 7/08 |
| 0268944 | 6/1988 | European Pat. Off. | G11B 20/14 |
| 3615952 | 11/1986 | Germany | H04L 25/40 |
| 58-95448 | 7/1983 | Japan | H04L 7/08 |
| 60-113367 | 6/1985 | Japan | G11B 20/14 |
| 90/13121 | 4/1990 | WIPO | |

OTHER PUBLICATIONS

IBM Technical Journal vol. 22 No. 8B Jan. 1980 pp. 3835 to 3838 "Phased-Locked Clock Generstor" by P/A. Beaven.

*Primary Examiner*—Robert W. Beausoliel, Jr.
*Assistant Examiner*—T. Tu
*Attorney, Agent, or Firm*—Joseph S. Tripoli; Joseph L. Laks; Harvey D. Fried

[57] ABSTRACT

An apparatus for distinguishing a wanted signal in a binary signal sequence having both wanted signals and interference signals includes the step of generating a correction value which has a first value to indicate a wanted binary signal and a second value to indicate a binary interference signal. The wanted signal has a preselected maximum number of bits. A first counter counts the bits of the binary signal sequence and changes the correction value from the first value to the second value when the preselected maximum is exceeded. The correction value is reset to the first value when the temporal spacing between two occurrences of excesses of the preselected maximum number exceeds a predetermined spacing.

8 Claims, 1 Drawing Sheet

METHOD AND APPARATUS FOR RECOGNIZING VALID COMPONENTS IN A DIGITAL SIGNAL

This is a continuation of application Ser. No. 07/863,979 filed Apr. 6, 1992 which is a continuation of PCT application PCT/EP 90/01390 filed Aug. 22, 1990 by Werner Scholz and titled "Circuit For The Recognition Of The Wanted Signal In A Binary Signal".

This invention relates generally to binary signal transmission and particularly to the recognition of interference signals in a binary signal.

The transmission of digital signals requires reliable information as to whether the binary input signal is a wanted (desired) signal component or merely an amplified and limited interference signal component. Herein, it is assumed that the input signal is present in binary form; i.e. it is available at the output of an input amplifier, equalizer and level detector. A circuit for discriminating a wanted signal from interference which is advantageous and practicable with a phase locked loop (PLL) circuit having a counter phase discriminator is described, in EP 0 264 035, corresponding to DE-OS 36 34 751. In this circuit, it is necessary to assure that the adjustment of an up/down-counter is not changed during the periods when a wanted signal is not present because a change would cause a change in the center frequency of the VCO oscillator of the PLL circuit and result in a lengthening of the input time of the PLL at the start of the next signal period.

Also, in a PLL circuit described in PCT application WO 90/13121 corresponding to U.S. Ser. No. 07/776,053, now abandoned, the wanted signal periods and the idle times must be distinguished. In the circuit described in this patent the changeover occurs in response to a switching voltage which is derived from the rotation of a head wheel. However, with this circuit undesirable tuning changes of the VCO oscillator can occur if interference signals are supplied instead of the wanted signal during the time that the tape and head contact. For example, problems can arise, when a blank area of the tape is scanned, or when during recording or reproduction one of the heads is dirty, or when errors are found in the track.

It is an object of the invention to provide a simple method and circuit for reliably recognizing wanted signals components from interference signal components in a binary signal and which can be achieved using digital operating components.

The invention is based on the knowledge that a binary signal which is generated from an interference signal exceeds the run-length range of the wanted signal, in a very short time period. As used herein the term "run-length" means the number of bits in the incoming binary signal between two transitions of the signal, that is, the number of consecutive like-valued bits (consecutive 0-valued bits or consecutive 1-valued bits). The invention exploits this knowledge and generates a correction value which distinguishes wanted signals from interference signals. A circuit for carrying out the inventive method operates particularly reliably and quickly and is readily integrated as a pure digital circuit. An intrinsic advantage of the recognition of the wanted signal directly from the input signal also exists in that the feeder of an external trace signal of a wanted signal, for example from the head change-over, the channel decoder or the drop-out recognition can be omitted.

The invention is explained with reference to the FIGURES in which.

Figure 1:
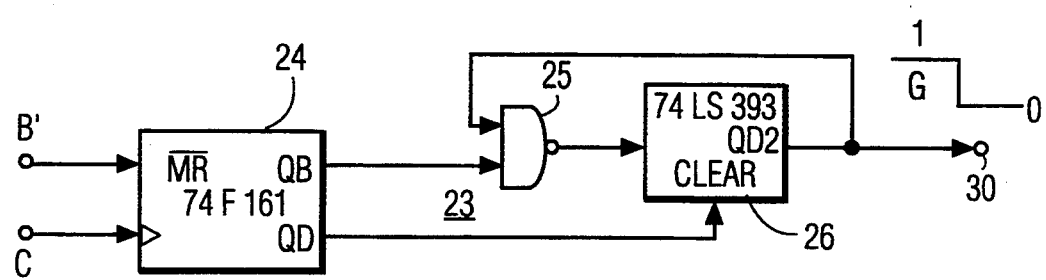
FIG. 1 is preferred embodiment of a circuit for carrying out the inventive method.

The circuit shown in FIG. 1 is particularly useful with binary signals in 8/10 modulation (8-bit resolution converted or consecutive 1-valued bits) having a maximum run-length of 6 bits and bit rates up to about 50 Mbit/s. The counter 24 monitors the successive run-lengths of the incoming binary signal B'. The counter 24 is reset with each level transition of the input signal. When at least eight clock pulses are counted between two transitions of the input signal B' then, and only then, the output terminal QD goes to 1 (high) and resets the counter 26 which is arranged in the second stage and which times the run-length. The cycle does not need to be synchronized with the input signal. When output terminal QD goes high counter 26 is reset and output terminal 30 goes low. The counter 26 then monitors the extent of the run-length excesses which are received from the counter 24. The counting range of the counter 26 is adjusted to the maximum extent of the run-length excesses during the idle times of the signal. After every 128 pulses from the output of the NOR gate 25 the counter 26 output goes to 1 unless a reset has occurred as a result of a run-length excess. These resets occur sufficiently rapidly during the idle times of the signal to permit the correction value G, which is generated at the output terminal 30, to indicate whether a wanted signal has been received, or whether an interference signal has been received and output terminal 30 remains on zero. The correction value G can, as further illustrated in of FIG. 2, carry out a desired change-over between the operation for a wanted signal and the operation for a pure interference signal. The number of the clock pulses C, which may lie between two run-length excesses is, for example approximately 4×128=512, because the counting pulse for the counter 26 is taken from the second flip-flop (QB) of the counter 24. Thus, output terminal 30 returns to high when the temporal spacing 2 or time interval, between two run-length excesses exceeds a predetermined spacing.

Figure 2:
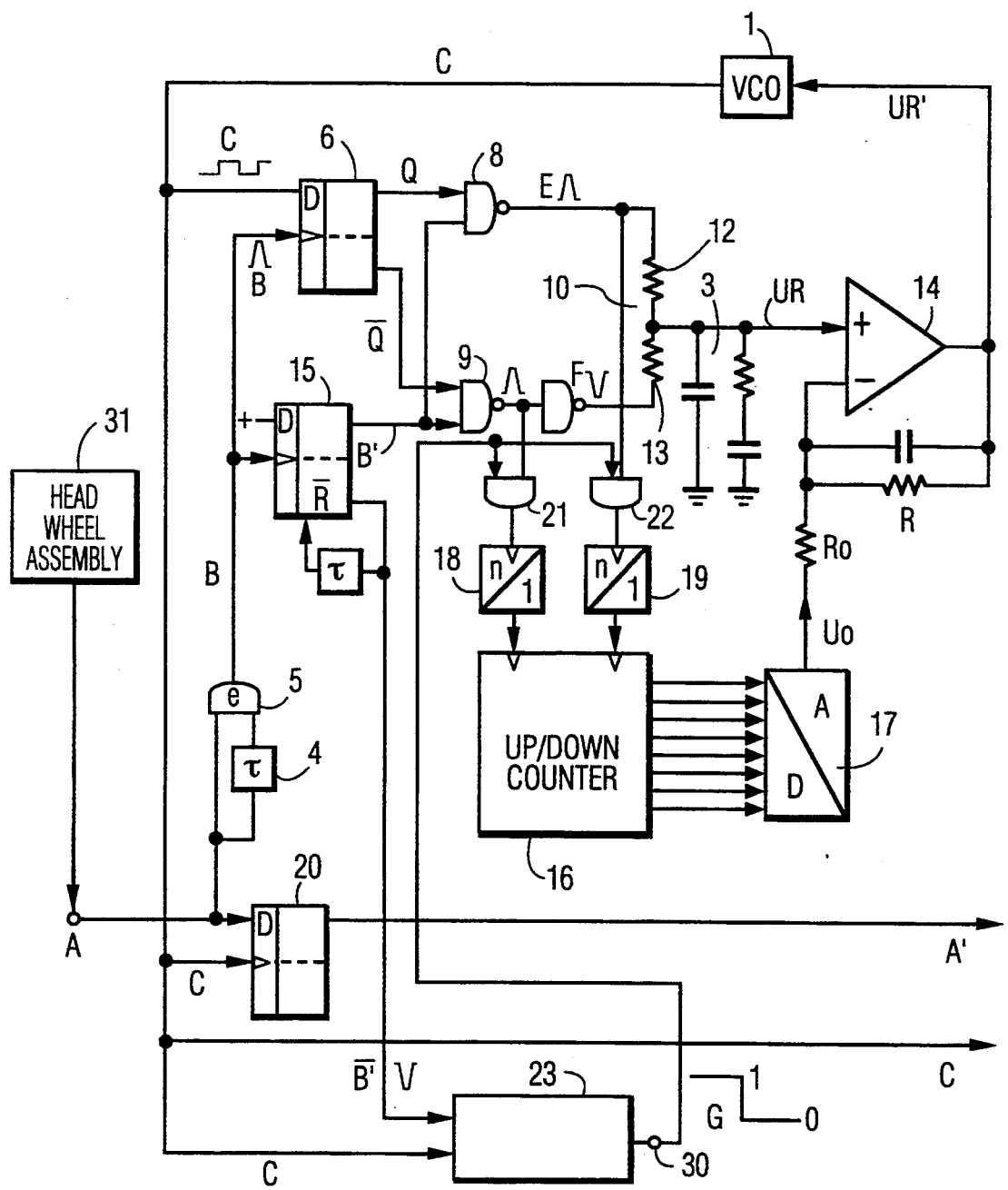
FIG. 2 shows the preferred embodiment of FIG. 1 incorporated into a prior art circuit having counter phase discriminator.

When the wanted signal is almost interference-free, the run-length cannot reach the value of 8. The output terminal 30 of the counter 26 then is high and the NOR gate 25 is inhibited. This state is maintained and can only be terminated by a reset of the counter 26 as a result of a run-length excess. The signal G=1 ensures that the up/down-counter 16 in FIG. 2 is working and the center frequency of the oscillator 1 is constantly adjusted to the optimum value. Every run-length excess indicates that the signal present at that moment is not suitable for the adjustment of the frequency of the oscillator 1. Hence, the adjustment is immediately interrupted by resetting the counter 26 and is not continued until after the establishment of flawless signal conditions as described above.

FIG. 2 shows the circuit 23 of FIG. 1 incorporated into the PLL circuit, described in DE-OS 36 34 751. A narrow pulse B is generated from each level transition of the binary input signal A by means of the EXOR gate 5 and the delay component 4. Signal A is generated by headwheel assembly 31. Likewise, the flip-flop 15 generates pulses B' having a particular width. The pulse B' serves as a transit time correction for the flip-flop 6 which generates a change-over voltage Q. The change-over voltage Q effects the feeding of the pulses B to the output of either NAND gate 8 OR NAND gate 9. Which one of the NAND gates 8 or 9 is actuated is dependent upon whether pulse B starts before or after the decaying edge of the output voltage C of the VCO oscillator 1.

For the purpose of generating the regulating voltage UR, the output voltage E of the NAND gate 8 and the voltage F, which is the compliment of voltage F from NAND gate 9, are added by means of the resistors 12 and 13. The network 3 effects low pass filtering of voltage UR. Voltage UR is fed by the amplifier 14, as the regulating voltage UR' to the oscillator 1. The level of the regulating voltage, and thus, the center frequency of the oscillator 1, is determined by the output voltage Uo of the digital-to-analog converter 17. The input signal for the digital-to-analog converter 17 is supplied by the up/down counter 16. The counter 16 receives counting pulses from the frequency dividers 18 and 19 when NAND gates 21, 22 are not inhibited, i.e. when output terminal 30 of circuit 23 is high. This only occurs when the binary input signal A is a wanted signal because terminal 30 is low when counter 26 is reset in response to a run-length excess.

With a wanted binary signal A the level transitions accumulate in the widths of whole-number multiples of the bit duration. With equal frequency dividers 18 and 19 output voltage Uo changes until the pulse numbers at the outputs of the NAND 8 and 9 coincide in the mean. However, this means that the level transition accumulations, which are illustrated by the well known eye pattern, are symmetrically arranged about a level transition of the output voltage C of the oscillator 1. The other level transition must then lie in the center of the eye with equal length semi-waves of the voltage C and thereby, be suitable for the error-free scanning of the input signal A. In this case, the scanning of the input signal A occurs in the flip-flop 20 by means of the positive edge of signal C.

I claim:

1. A digital data recognition circuit, comprising:
    a signal source for supplying a digital signal, said digital signal having wanted components of valid data bits and interference components of invalid data bits which tend to alternate with one another;
    first counting means for counting the number of immediately successive like-valued bits in said digital signal, said first counting means being coupled for receiving a first clock signal and said digital signal and being set to a first starting number by each level transition of said digital signal, said first counting means having a first output indicative of a predetermined number of consecutive like-valued bits in said digital signal and a second output for supplying a second clock signal which is derived from said first clock signal;
    second counting means for measuring each time interval between successive occurrences of counting said predetermined number of consecutive like-valued bits in said digital signal, said second counting means having a clock input, having a control input coupled to said first output of said first counting means, and having a third output having a first value indicative of valid data being present in said digital signal and a second value indicative of invalid data being present in said digital signal; and,
    gating means for implementing a logical NOR function, having respective inputs for receiving said second clock signal of said first counting means and said third output of said second counting means, and an output coupled to said clock input of said second counting means.

2. A video playback apparatus, comprising:
    means for generating a digital video signal from a recorded medium during playback operation, said video signal having wanted components of valid data bits and interference components of invalid data bits which tend to alternate with one another;
    a phase locked loop having a controllable oscillator for generating a first clock signal for synchronizing said video signal during said playback operation, means for adjusting said controllable oscillator and means for inhibiting adjustment of said controllable oscillator responsive to a control signal;
    first counting means responsive to said video signal for counting run-lengths of consecutive like-valued data bits and generating both a first output signal indicative of said interference component being present each time any said run-length exceeds a predetermined number of said consecutive like-valued data bits and a second output for a second clock signal derived from said first clock signal;
    second counting means responsive to said first output signal for measuring time intervals between successive ones of said run-lengths exceeding said predetermined number of consecutive like-valued data bits by counting clock pulses of said second clock signal, and generating said control signal for said inhibiting means, said control signal having a state indicative of said interference component being present in said video signal only after said first output signal is received and before any of said time intervals exceeds a predetermined duration; and,
    gating means for implementing a logical NOR function, said gating means having respective inputs coupled for receiving said second output signal from said first counting means and said control signal from said second counting means and having an output coupled for supplying said clock pulses to said second counting means.

3. A method for processing a binary signal sequence, the binary signal sequence having wanted signal components and interference components alternating in the binary signal sequence, and the alternating wanted signal components having a number of immediately successive like-valued bits which lies in a predetermined range, the method comprising the steps of:
    generating a correction signal having a first value indicative of the wanted signal components being present in the binary signal sequence and a second value indicative of the interference components being present in the binary signal sequence;
    counting the number of immediately successive like-valued bits of the binary signal sequence;
    setting the correction signal to the second value in response to the counting of more than an upper limit of the predetermined range of numbers of the like-valued bits in the alternating wanted signal components;
    measuring each time interval between successive occurrences of counting more than the upper limit of the predetermined range of numbers of the like-valued bits in the alternating wanted signal components; and, resetting the correction signal to the first value whenever the time interval measured between the successive occurrences of counting more than the upper limit of the predetermined range of numbers of the like-valued bits in the alternating wanted signal components exceeds a predetermined value.

4. The method of claim 3, further comprising the step of generating a clock signal for the measuring step by logically NORing a first signal representing a result of the counting step and a second signal representing a result of the measuring step to stop counting at a predetermined count result.

5. The method of claim 4, further comprising the step of supplying the second signal as the control signal.

6. The method of claim 3, comprising the steps of:
generating a clock signal for the measuring step by logically NORing a first signal representing a first result of the counting step and a second signal representing a result of the measuring step to stop counting at a predetermined count result; and, supplying a third signal representing a second result of the counting step as a reset signal for restarting the measuring step.

7. The method of claim 6, further comprising the step of supplying the second signal as the control signal.

8. A circuit for processing a binary signal, the binary signal having wanted signal components and interference components alternating in the binary signal, and the alternating wanted signal components having a number of immediately successive like-valued bits which lies in a predetermined range, the circuit comprising:

a first counter for counting the number of immediately successive like-valued bits in said binary signal, said first counter having a first input for receiving said binary signal and having a first clock input for receiving a first clock signal, and said first counter generating a first output signal in response to the counting of more than an upper limit of said predetermined range of numbers of the like-valued bits in said alternating wanted signal components and generating a second clock signal;

a second counter for measuring each time interval between successive occurrences of counting more than said upper limit of said predetermined range of numbers of the like-valued bits in said alternating wanted signal components, said second counter having a control input coupled for receiving said first output signal from said first counter and having a clock input, and said second counter generating a detection output signal having a first value indicative of said wanted signal components being present in said binary signal sequence and a second value indicative of said interference components being present in said binary signal sequence; and, a gate for implementing a logical NOR function, having respective inputs coupled for receiving said second clock signal from said first counter and said detection output signal from said second counter and having an output coupled to said clock input of said second counter, said first counter restarting from a predetermined number with every level transition of said binary signal sequence and said second counter being reset each time said first counter counts more than said upper limit, said detection signal distinguishing between said wanted signal components and said interference components in said binary signal sequence.

* * * * *